(12) United States Patent
Wu et al.

(10) Patent No.: US 11,139,430 B2
(45) Date of Patent: Oct. 5, 2021

(54) PHASE CHANGE RANDOM ACCESS MEMORY AND METHOD OF MANUFACTURING

(71) Applicant: TAIWAN SEMICONDUCTOR MANUFACTURING CO., LTD., Hsinchu (TW)

(72) Inventors: Jau-Yi Wu, Hsinchu County (TW); Shao-Ming Yu, Zhubei (TW); Shih-Chi Tsai, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/591,878

(22) Filed: Oct. 3, 2019

(65) Prior Publication Data
US 2020/0136036 A1 Apr. 30, 2020

Related U.S. Application Data

(60) Provisional application No. 62/753,903, filed on Oct. 31, 2018.

(51) Int. Cl.
*H01L 45/00* (2006.01)
*H01L 27/24* (2006.01)

(52) U.S. Cl.
CPC ........... *H01L 45/126* (2013.01); *H01L 27/24* (2013.01); *H01L 45/06* (2013.01); *H01L 45/14* (2013.01); *H01L 45/1675* (2013.01); *H01L 45/1691* (2013.01)

(58) Field of Classification Search
CPC ... H01L 45/126; H01L 27/24; H01L 45/1691; H01L 45/14; H01L 45/1675; H01L 45/06; H01L 45/144
USPC ............................. 257/3, 4, 5; 438/382, 652
See application file for complete search history.

(56) References Cited

U.S. PATENT DOCUMENTS

| 7,442,602 | B2 | 10/2008 | Park et al. |
| 7,671,360 | B2 | 3/2010 | Sato et al. |
| 2006/0226489 | A1* | 10/2006 | Burr et al. ............. H01L 45/06 257/2 |
| 2009/0045389 | A1 | 2/2009 | Eun et al. |
| 2012/0025162 | A1 | 2/2012 | Shin et al. |
| 2012/0280199 | A1 | 11/2012 | Takagi |
| 2013/0344676 | A1 | 12/2013 | Chang et al. |
| 2014/0104939 | A1 | 4/2014 | Karpov et al. |

(Continued)

FOREIGN PATENT DOCUMENTS

| DE | 102006028971 A1 | 2/2007 |
| JP | 2005525690 A | 8/2005 |

(Continued)

*Primary Examiner* — Thinh T Nguyen
(74) *Attorney, Agent, or Firm* — McDermott Will & Emery, LLP

(57) ABSTRACT

A method includes forming a dielectric layer over a conductive layer, and forming a sidewall spacer in an opening in the dielectric layer. The opening exposes a portion of the conductive layer. A bottom electrode layer is formed over the conductive layer and the sidewall spacer. A phase change material layer is formed over the bottom electrode layer, and a top electrode layer is formed over the phase change material layer. In an embodiment, the method includes recess etching the bottom electrode layer before forming the phase change material layer.

20 Claims, 14 Drawing Sheets

(56) References Cited

U.S. PATENT DOCUMENTS

2015/0055408 A1    2/2015   Castro et al.
2015/0188050 A1    7/2015   Kim et al.

FOREIGN PATENT DOCUMENTS

| KR | 100892667 B1 | 4/2009 |
|----|--------------|--------|
| KR | 20120012094 A | 2/2012 |
| TW | 200840103 A | 10/2008 |
| TW | I395357 B | 5/2013 |
| TW | 201810749 A | 3/2018 |
| WO | 03/021693 A2 | 3/2003 |

\* cited by examiner

PHASE CHANGE RANDOM ACCESS MEMORY AND METHOD OF MANUFACTURING

RELATED APPLICATION

This application claims priority to U.S. Provisional Patent Application No. 62/753,903 filed Oct. 31, 2018, the entire contents of which are incorporated herein by reference.

BACKGROUND

Phase change random access memory (PCRAM) is a non-volatile memory device making use of different resistive phases and heat induced phase transition between the phases of phase change materials including chalcogenide and resistive materials. A PCRAM is composed of many cells each of which functions independently. A PCRAM cell mainly includes a heater and a resistor which is a data storage element made mainly of a reversible phase change material to provide at least two dramatically different resistivities for logical "0" state and "1" state.

To read a state (data) from the PCRAM cell, a sufficiently small current is applied to the phase change material without triggering the heater to generate heat. In this way, the resistivity of the phase change material can be measured and the states representing the resistivities, i.e. a "0" state for high resistivity or a "1" state for low resistivity can be read.

To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can thus be in a pulse form.

As device size decreases it becomes more difficult to provide phase change random access devices with smaller critical dimensions while retaining sufficient joule heating efficiency. A reduced size bottom electrode for a phase change random access memory having good joule heating efficiency is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
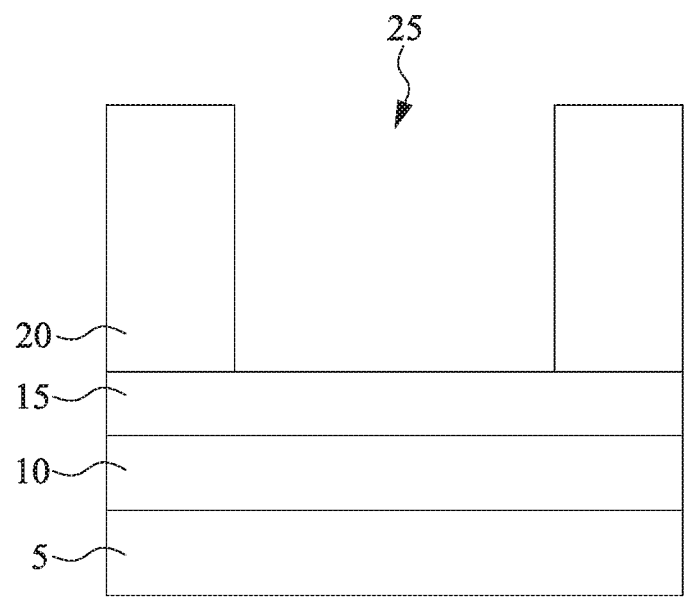
FIG. 1 illustrates one of the various stages of a sequential operation of a method of manufacturing a PCRAM according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

FIGS. 1 to 5B illustrate a sequential operation of a method of manufacturing a PCRAM according to embodiments of the present disclosure. It is understood that in the sequential manufacturing process, one or more additional operations can be provided before, during, and after the stages shown in FIGS. 1-5B, and some of the operations described below can be replaced or eliminated for additional embodiments of the method. The order of the operations/processes may be interchangeable.

In some embodiments, an electrically conductive layer 15 is formed over a interlayer dielectric layer (ILD) 10. In some embodiments, the interlayer dielectric layer 10 is formed over a substrate 5.

In some embodiments, the substrate 5 includes a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 5 is made of crystalline Si. In some embodiments, the substrate 10 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate.

In some embodiments, transistors such as planar MOSFETs, FinFETs, and/or Gate All Around (GAA) transistors, metal lines such as poly-lines and interconnect metal lines, and transistors that control the operations of the PCRAM are formed over the substrate 5, and are embedded in one or more ILD layers 10. In some embodiments, the PCRAM is formed over semiconductor devices, wiring layers, or interconnect layers. In some embodiments, the PCRAM is located in an M3, M4, M5, or higher wiring layer. In some embodiments, one or more dielectric layers covering the underlying transistors are formed between the substrate 5 and the conductive layer 15.

The conductive layer 15 includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In a certain embodiment, the conductive layer 15 is a metal layer, such as copper or a copper alloy. In some embodiments, the conductive layer 15 is a bit line. In some embodiments, the conductive layer 15 is formed by chemical vapor deposition (CVD), pulsed laser deposition (PLD), atomic layer deposition (ALD), sputtering, electroplating, or any other thin film deposition method.

FIG. 1 shows a dielectric layer 20 having an opening 25 formed on the conductive layer. The dielectric layer 20 is formed of one or more layers of a silicon oxide, silicon nitride, silicon oxynitride (SiOC), SiOCN, SiCN, alumina, fluorine-doped silicate glass (FSG), a low-k dielectric material, or other various suitable dielectric materials used in manufacturing semiconductor devices. In a certain embodiment, the dielectric layer 20 is formed of silicon dioxide. In some embodiments, the dielectric layer 20 has a thickness ranging from about 10 nm to about 200 nm. In some embodiments, the thickness of the dielectric layer 20 ranges from about 20 nm to about 100 nm. In some embodiments, the dielectric layer 20 is formed by CVD, ALD, or PVD over the conductive layer 15. The dielectric layer is then subjected to photolithographic and etching operations to form the opening 25 in the dielectric layer exposing a portion of the conductive layer 15.

Figure 2:
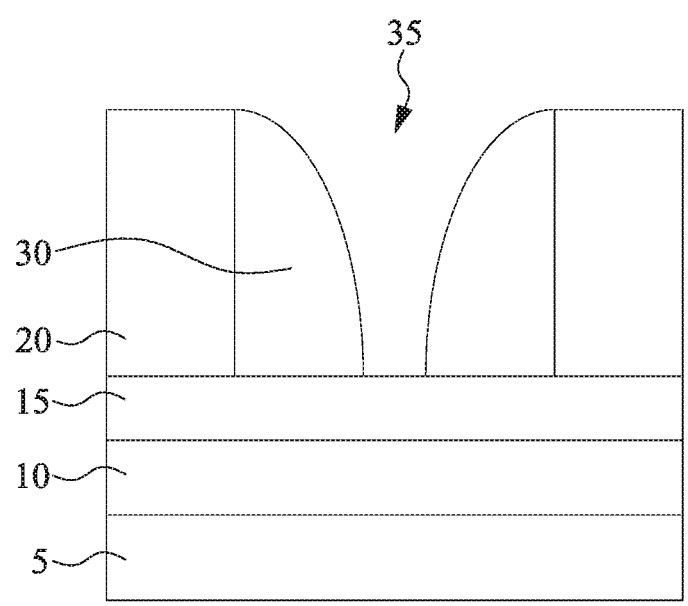
FIG. 2 illustrates one of the various stages of a sequential operation of a method of manufacturing a PCRAM according to an embodiment of the present disclosure.

A dielectric sidewall spacer 30 is subsequently formed on the sidewall of the opening 25 formed in the dielectric layer 20, as shown in FIG. 2. The material of the sidewall spacer 30 can be the same or different from the dielectric layer 20. In some embodiments, the sidewall spacer 30 includes one or more layers of a silicon oxide or silicon nitride, such as $SiO_2$ or $Si_3N_4$. In some embodiments, the sidewall spacer 30 is formed by conformally depositing an insulating material layer over the conductive layer 15 and in the opening 25, and anisotropically etching the insulating material layer to expose the conductive layer 15. As shown in the cross-sectional view of FIG. 2, the space 35 between the sidewall spacers 30 has a tapered shape having a smaller bottom than a top. In some embodiments, the width of the space 35 gradually decreases from the top to the bottom. In some embodiments, the size of the bottom opening of the space 35 is in a range from 0.5 nm to 50 nm.

Figure 3:
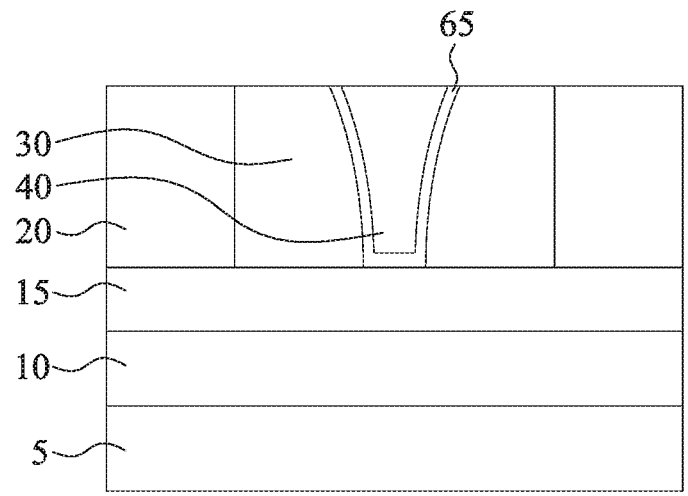
FIG. 3 illustrates one of the various stages of a sequential operation of a method of manufacturing a PCRAM according to an embodiment of the present disclosure.

Next, a bottom electrode layer 40 is formed over the conductive layer and in the space 35 between the sidewall spacers 30, as shown in the cross-sectional view of FIG. 3. In some embodiments, a liner layer 65 is formed over the conductive layer and the sidewall spacer before the bottom electrode layer 40 is formed. In some embodiments, the liner layer 65 is formed of one or more layers of a conductive nitride, including TaN and TiN. In some embodiments, after forming the liner layer 65 and/or bottom electrode layer 40, a planarizing operation, such as chemical mechanical polishing (CMP) is performed, to form a planarized upper surface of the dielectric layer 20, the sidewall spacer 30, and the bottom electrode 40 (and the liner layer 65), as shown in FIG. 3.

In some embodiments, the bottom electrode layer 40 includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In some embodiments, the bottom electrode layer 40 and/or the liner layer 65 is formed by chemical vapor deposition (CVD), pulsed laser deposition (PLD), sputtering, atomic layer deposition (ALD) or any other thin film deposition methods.

In a certain embodiment, the liner layer 65 is formed of TaN and the bottom electrode layer 40 is formed of TiN.

The bottom electrode layer 40 is subsequently recess etched, in some embodiments, to form a recess 35' using a suitable etchant selective to the bottom electrode layer 40, as shown thereby forming a substantially trapezoidal shaped bottom electrode 40 between the insulating sidewall spacers 30, as shown in the cross-sectional view of FIG. 4. In some embodiments, the recessed amount is in a range from about 5 nm to about 100 nm.

Figure 5A:
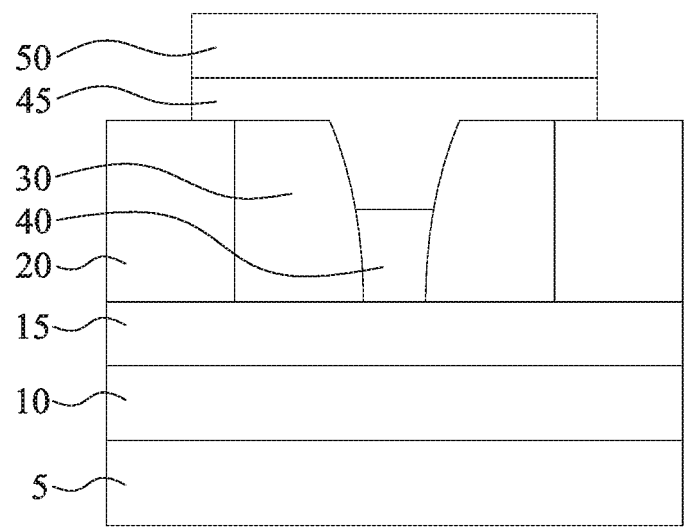
FIGS. 5A and 5B illustrate various stages of a sequential operation of a method of manufacturing a PCRAM according to an embodiment of the present disclosure.
Figure 5B:
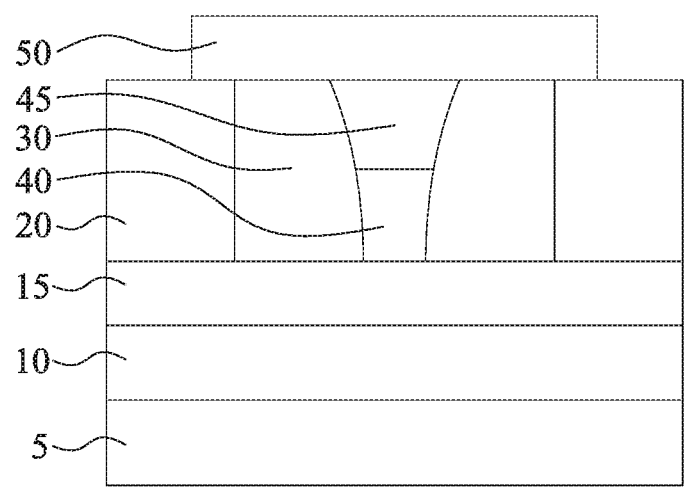

Next, a phase change material (PCM) layer 45 is formed over the bottom electrode 40 in the recess 35', and a top electrode layer 50 is formed over the PCM layer 45, as shown in FIGS. 5A and 5B. The phase change material for the PCM layer 45 includes one or more layers of a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. In some embodiments, the phase change material layer 45 is formed by chemical vapor deposition (CVD), pulsed laser deposition (PLD), sputtering, atomic layer deposition (ALD) or any other thin film deposition method.

The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer for different needs, the material of the phase change material layer may be doped with various elements at different amounts to adjust the proportion of the short range order and the long range order inside the bonding structure of the material. The doped element may be any element used for semiconductor doping through the use of, for example, ion implantation.

The top electrode layer 50 is subsequently formed over the phase change material layer 45. The top electrode layer 50 includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In some embodiments, the top electrode layer 50 is made of TiN. In some embodiments, the top electrode layer 50 is formed by chemical vapor deposition (CVD), pulsed laser deposition (PLD), sputtering, atomic layer deposition (ALD) or any other thin film deposition method.

In some embodiments, the phase change material layer 45 is formed and then the top electrode layer 50 is formed over the phase change material layer 45, and both the phase change material layer 45 and top electrode layer 50 are patterned, as shown in FIG. 5A. In other embodiments, the phase change material layer 45 is formed and then planarized to the same height as the sidewall spacer 30, such as by CMP, and then the top electrode layer 50 is formed over the phase change material layer 45, as shown in FIG. 5B. In some embodiments, the top electrode layer 50 is formed over and in contact with the dielectric sidewall spacer 30. In some embodiments, the top electrode layer 50 is formed over and in contact with the dielectric layer 20. After the top electrode layer 50 is formed, one or more interlayer dielectric layers are formed over the top electrode layer 50.

Figure 6A:
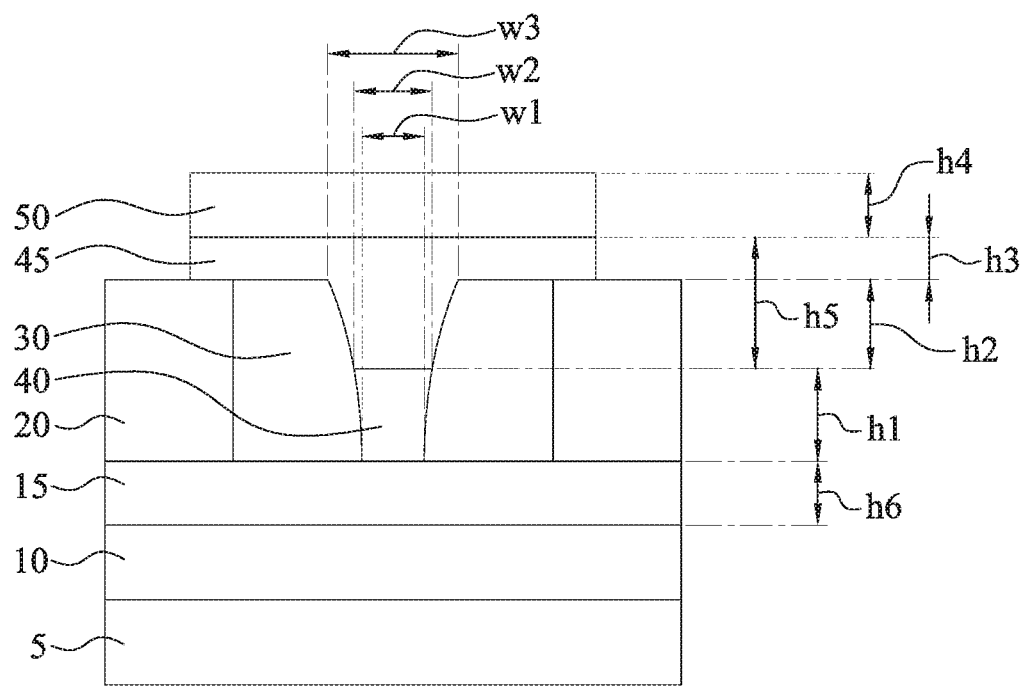
FIGS. 6A and 6B illustrate a phase change random access memory device according to an embodiment of the disclosure.
Figure 6B:
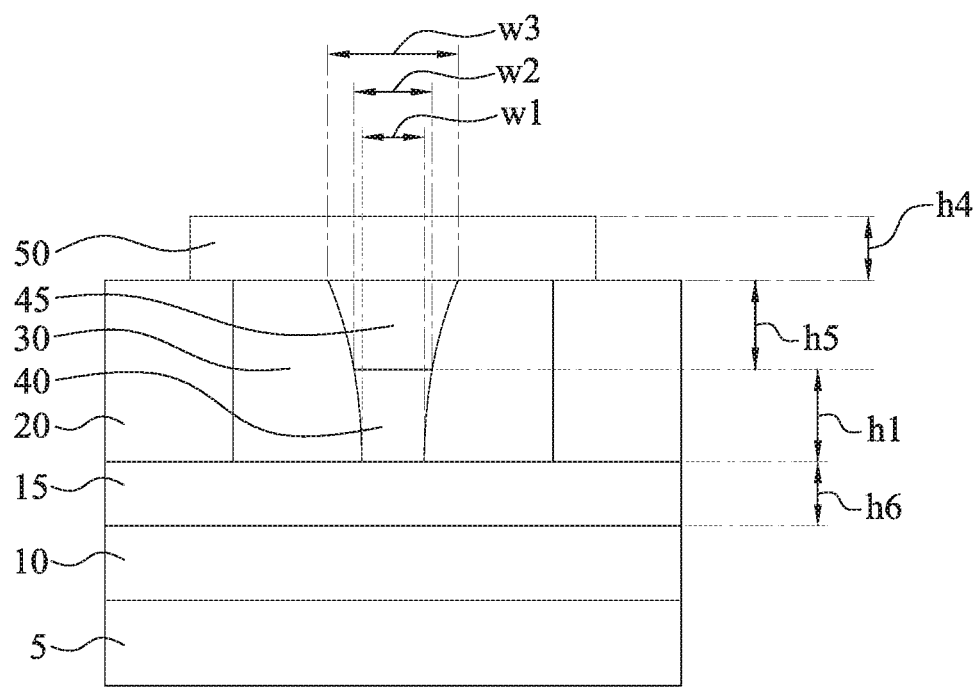

Phase change random access memory devices according to embodiments of the disclosure are shown in FIGS. 6A and 6B. FIG. 6A is a cross sectional view of one unit cell of the PCRAM device. In some embodiments, the bottom electrode layer 40 has a thickness h1 ranging from about 5 nm to about 100 nm, and in other embodiments, the bottom electrode layer has a thickness h1 ranging from about 10 nm to about 50 nm. In some embodiments, the bottom electrode layer 40 has a bottom surface width w1 ranging from about 0.5 nm to about 50 nm, and in other embodiments, the bottom electrode layer 40 has a bottom surface width w1 ranging from about 1 nm to about 15 nm. In some embodiments, the bottom electrode layer 40 has a top surface width w2 ranging from about 1 nm to about 70 nm, and in other embodiments, the bottom electrode layer 40 has a top surface width w2 ranging from about 3 nm to about 20 nm. The top surface width w2 of the bottom electrode layer 40 is greater than the bottom surface width w1 of the bottom electrode layer 40. A smaller interface width w2 between the bottom electrode layer 40 and the phase change material layer provides a reduced write current in some embodiments. The bottom electrode layer 40 has a substantially trapezoidal shape as viewed in cross section.

In some embodiments, the phase change material layer 45 has a thickness h5 ranging from about 5 nm to about 200 nm, and in other embodiments, the phase change material layer has a thickness h5 ranging from about 30 nm to about 100 nm. In some embodiments, the phase change material layer 45 extends a thickness h3 of about 10 nm to about 100 nm above a top surface of the sidewall spacer 30, and in other embodiments, the phase change material layer extends a thickness h3 of about 20 nm to about 50 nm above the top surface of the sidewall spacer. Increased thickness h3 of the portion of the phase change material layer extending above the sidewall spacers enables reduced write current in some embodiments. In some embodiments, the phase change material layer 45 has thickness h2 from the top of bottom electrode to the top of the sidewall spacer of about 5 nm to about 100 nm, and in other embodiments, the phase change material layer 45 has a thickness h2 from the top of the bottom electrode 40 to the top of the sidewall spacer 30 of about 10 nm to about 50 nm. Increased thickness h2 of the phase change material layer in the via and a reduced thickness h1 of the bottom electrode provide enables reduced write current in some embodiments. However, reduced bottom electrode thickness h1 increases electrical resistance of the bottom electrode in some embodiments. As the thickness h5 (h5=h2+h3) of the phase change material layer increases the write current is reduced in some embodiments. However, thicker phase change material layers 45 increase the overall thickness of the PCRAM device and device density is reduced.

In some embodiments, the top surface of the phase change material layer 45 is substantially coplanar with the top surface of the dielectric sidewall spacer 30 and the top surface of the dielectric layer 20. In some embodiments, the phase change material layer 45 has a bottom surface width w2 ranging from 1 nm to 70 nm, and in other embodiments, the phase change material layer 45 has a bottom surface width w2 ranging from about 3 nm to about 20 nm. In some embodiments, the phase change material layer 45 has a top surface width w3 at the height of the sidewall spacer 30 ranging from about 2 nm to about 100 nm, and in other embodiments, the phase change material layer 45 has a top surface width ranging from about 5 nm to about 30 nm. The top surface width w3 of the phase change material layer 45 is greater than the bottom surface width w2 of the phase change material layer 45. The phase change material layer 45 has a substantially trapezoidal shape as viewed in cross section in some embodiments.

In some embodiments, the top electrode layer 50 has a thickness h4 ranging from about 5 nm to about 100 nm, and in other embodiments, the top electrode layer 50 has a thickness ranging from about 10 nm to about 30 nm. Increased top electrode layer thicknesses h4 provides a reduced electrical resistance. However, increased top electrode layer thicknesses also increase the overall thickness of the PCRAM device and decreases device density.

In some embodiments, the conductive layer 15 has a thickness h6 ranging from about 20 nm to about 2,000 nm. In some embodiments, the thickness h6 of the conductive layer 15 ranges from about 40 nm to about 1,000 nm.

FIG. 6B is a cross-sectional view of one unit cell of the PCRAM device according to another embodiment. In this embodiment, an upper surface of the phase change material layer 45 is substantially coplanar with the upper surfaces of the sidewall spacer 30 and the dielectric layer 20. In other words, the thickness h3 of the phase change material layer 45 extending over the upper surface sidewall spacer 30 is about zero. The ranges of the thicknesses h1, h4, h5, and h6, of the bottom electrode layer 40, top electrode layer 50, phase change material layer 45, and conductive layer 15, respectively are the same as those of the corresponding layers in FIG. 6A in some embodiments. Likewise, the ranges of widths w1, w2, and w3 of the bottom surface of the bottom electrode layer 40, top surface of the bottom electrode layer 40, and top surface of the phase change material layer at the height of the sidewall spacer, respectively, are the same as those of the corresponding layers in FIG. 6A in some embodiments.

FIGS. 7A, 7B, 8A, 8B, 9A, 9B, 10A, 10B, 11A, 11B, 11C, 12, and 12B illustrate other embodiments of manufacturing a phase change random access memory device according to embodiments of the disclosure.

In some embodiments, a selector layer 55 is formed over the phase change memory layer 45, as shown in FIGS. 7B, 8B, 9B, and 10B. In a phase change memory array, for example, a cross-point array with hundreds or more memory cells, many problems disturbing the proper operation of a memory cell may occur. The problems may be electrical in nature, such as leakage current, parasitic capacitance, etc. The problems may also be thermal in nature, such as a thermal disturbance between memory cells. To solve the above problems, a switching device is used to reduce or avoid leakage current from an operating memory cell or from other memory cells passing along the resistive network. A switching device functioning like a diode device or a transistor device is used so that only the intended PCRAM cell(s) is(are) selected for read/write while other PCRAM cells are not turned on, and to reduce or prevent leakage current originating from the selected PCRAM cells. To provide accurate read/write operations, a selector layer having high on-state conductivity and infinite off-state resistance is desired to be formed over the phase change material layer to reduce the power dissipation in the resistive network of the PCRAM, leakage current and cross-talk disturbance, while making sure only the selected PCRAM cells are undergoing read/write operation. In this way, a reliable PCRAM can be formed. Considering the size of the switching device, a diode type (such as a pn junction diode, Schottky diode, metal-insulator transition (MIT), and ovonic threshold switch (OTS)) device may have a smaller size than a transistor type (such as a MOSFET, metal-oxide-semiconductor-field-effect-transistor) device. The selector layer may function as a diode type device with a diode junction formed within the selector layer. In some embodiments, the selector layer is formed over and patterned with the phase change material layer formed of the aforementioned materials to have the same size, greatly reducing the space within the PCRAM for the selector device, which is considered a limiting factor for the shrinking trend of memory devices. In some embodiments, the selector layer obviates the need for a transistor in the PCRAM device. In some embodiments, the selector layer provides a current-voltage non-linearity to the PCRAM, and this reduces leakage current.

Figure 7A:
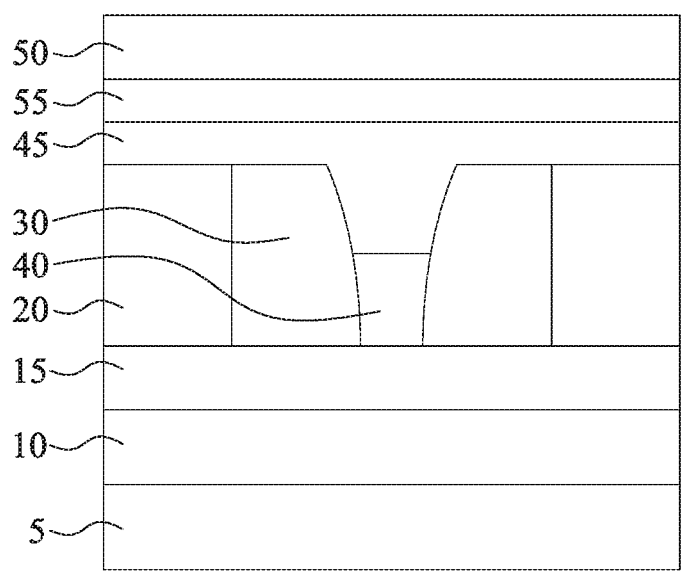
FIGS. 7A and 7B illustrate various stages of a sequential operation of a method of manufacturing a PCRAM according to an embodiment of the present disclosure.

As shown in FIG. 7A, a phase change material layer 45 is formed over the bottom electrode layer 40, sidewall spacer 30, and dielectric layer 20. Then, a selector layer 55 is formed over the phase change material layer 45, and a top electrode layer 50 is formed over the selector layer 55. The phase change material layer 45, the selector layer 55, and the top electrode layer 50 are patterned using photolithographic techniques to form the phase change random access memory device shown in FIG. 7B. In some embodiments, the dielectric layer 20 is etched during the patterning operation of the top electrode layer 50, selector layer 55, and phase change material layer 45.

Figure 8A:
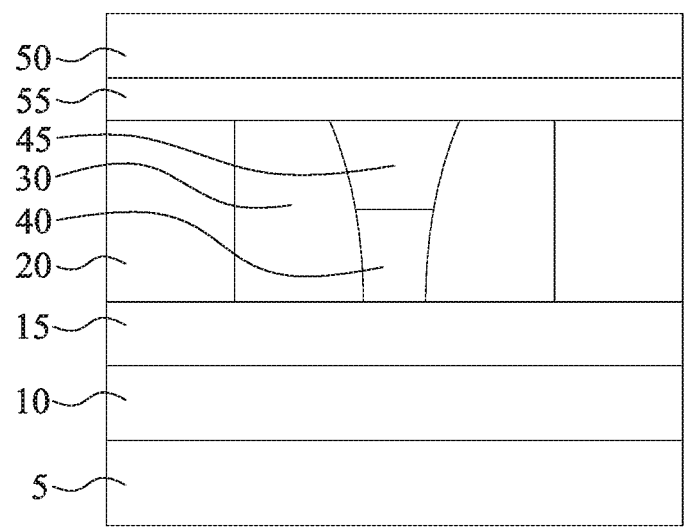
FIGS. 8A and 8B illustrate various stages of a sequential operation of a method of manufacturing a PCRAM according to an embodiment of the present disclosure.
Figure 8B:
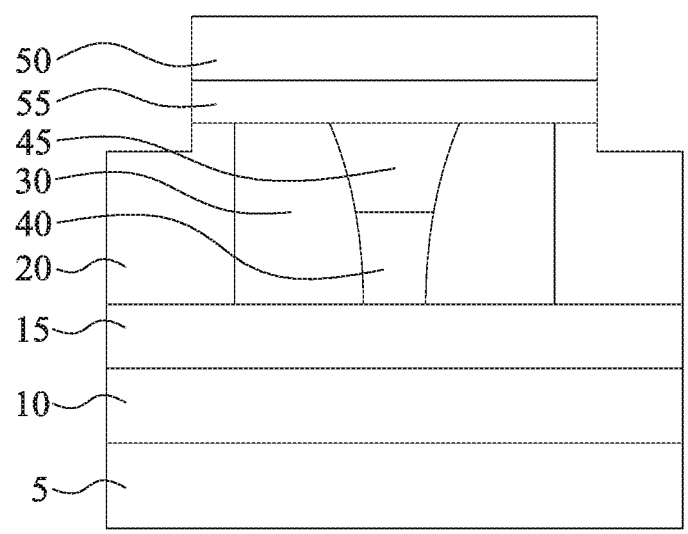

In another embodiment, as shown in FIG. 8A, the phase change material layer 45 is planarized to the height of the sidewall spacer 30, such as by CMP. Then, the selector layer 55 and top electrode layer 50 are formed, and patterned to form the phase change random access memory device as shown in FIG. 8B. In some embodiments, the dielectric layer 20 is etched during the patterning operation of the top electrode layer 50 and selector layer 55, as shown in FIG. 8B. In some embodiments, the selector layer 55 is formed over and in contact with the sidewall spacer 30 and the dielectric layer 20.

In some embodiments, the selector layer 55 is formed of one or more layers of $SiO_x$, $TiO_x$, $AlO_x$, $WO_x$, $Ti_xN_yO_z$, $HfO_x$, $TaO_x$, $NbO_x$, where x, y and z are non-stoichiometric values; a solid-electrolyte material containing one or more of Ge, Sb, S, Te; or N, P, S, Si, or Te doped AsGeSe or AsGeSeSi; or combinations thereof. In some embodiments, the selector layer 55 is an oxygen deficient transition metal oxide. In some embodiments, the selector layer 55 is formed by chemical vapor deposition (CVD), pulsed laser deposition (PLD), sputtering, atomic layer deposition (ALD) or any other suitable thin film deposition method.

In some embodiments, the selector layer 55 has a thickness h7 ranging from about 2 nm to about 50 nm, and in other embodiments, the selector layer 55 has a thickness h7 ranging from about 5 nm to about 20 nm. Higher selector layer thicknesses h7 will increase the operation voltage in PCRAM devices but will lower the leakage current in some embodiments. On the other hand, lower selector layer thicknesses h7 will decrease the operation voltage but will increase the leakage current.

Figure 9A:
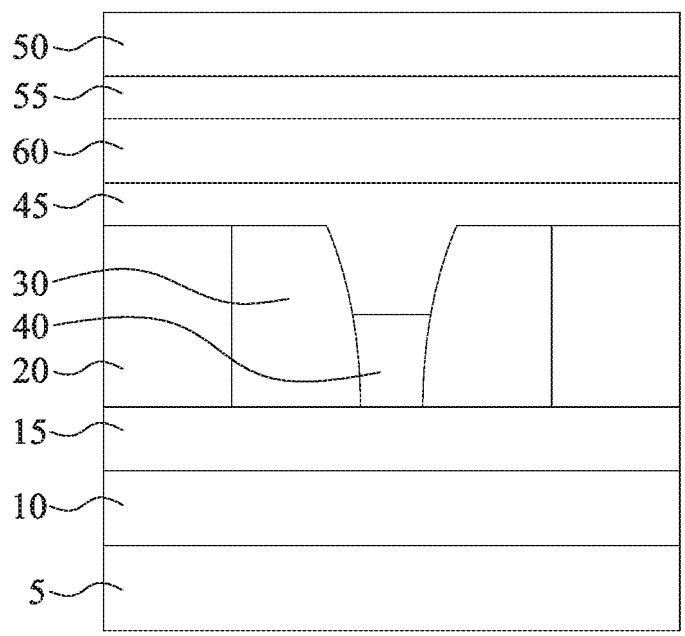
FIGS. 9A and 9B illustrate various stages of a sequential operation of a method of manufacturing a PCRAM according to an embodiment of the present disclosure.
Figure 9B:
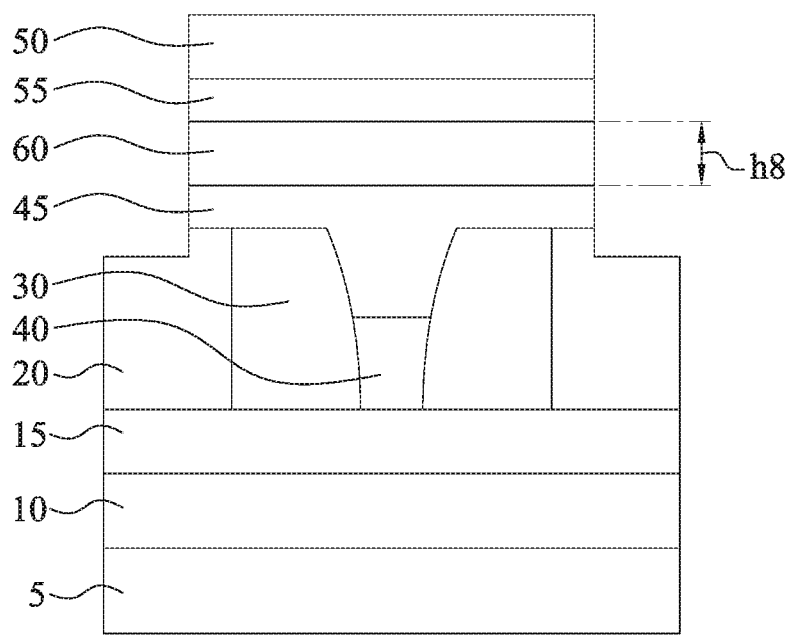

As shown in FIG. 9A, a phase change material layer 45 is formed over the bottom electrode layer 40, sidewall spacer 30, and dielectric layer 20. Then, a middle electrode layer 60 is formed over the phase change material layer 45, a selector layer 55 is formed over the middle electrode layer 60, and a top electrode layer 50 is formed over the selector layer 55. The phase change material layer 45, middle electrode layer 60, selector layer 55, and top electrode layer 50 are patterned using photolithographic and etching techniques to form the phase change random access memory device shown in FIG. 9B. In some embodiments, the dielectric layer 20 is etched during the patterning operation of the top electrode layer 50, selector layer 55, middle electrode layer 60, and phase change material layer 45, as shown in FIG. 9B. In some embodiments, the middle electrode layer 60 isolates the phase change material 45 from the selector layer 55 and prevents material intermixing between the phase change material layer 45 and the selector layer.

In some embodiments, the middle electrode layer 60 has a thickness h8 ranging from about 2 nm to about 50 nm, and in other embodiments, the middle electrode layer 60 has a thickness h8 ranging from about 5 nm to about 20 nm. In some embodiments, greater middle electrode thicknesses h8 improves the isolation performance and reduces the middle electrode resistance. However, increased middle electrode thicknesses h8 increase the thickness of the PCRAM device and reduces device density.

In some embodiments, the middle electrode layer 60 includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof.

Figure 10A:
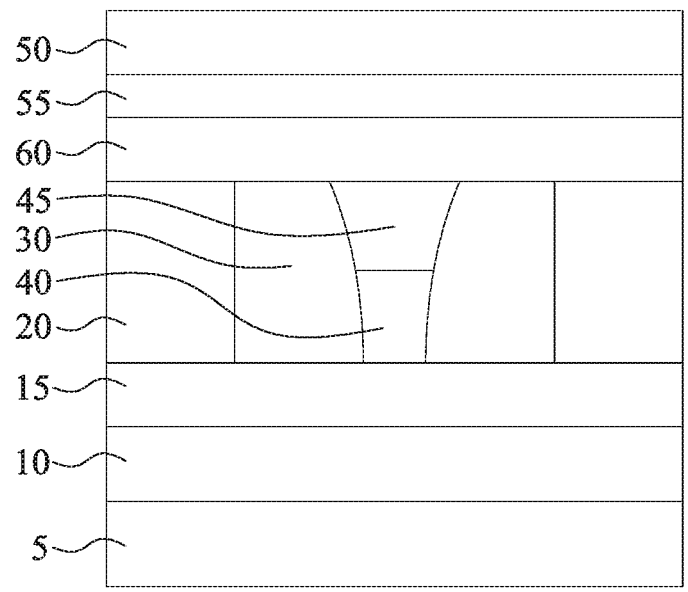
FIGS. 10A and 10B illustrate various stages of a sequential operation of a method of manufacturing a PCRAM according to an embodiment of the present disclosure.
Figure 10B:
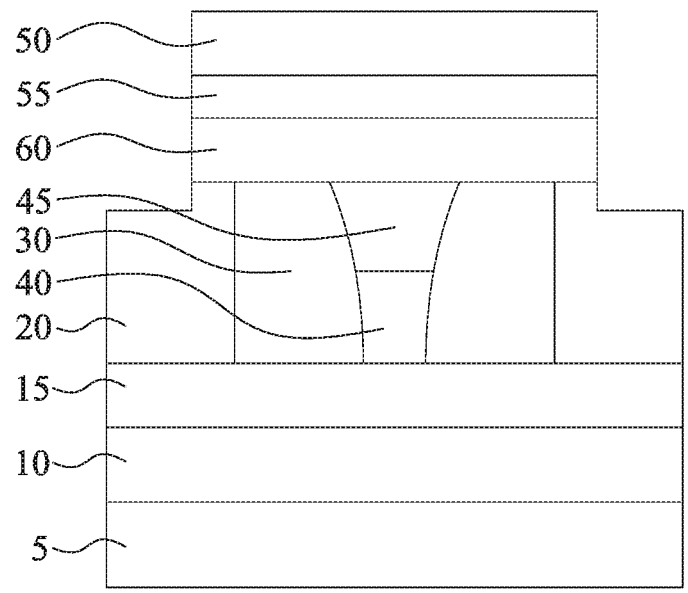

In another embodiment, as shown in FIG. 10A, the phase change material layer 45 is planarized, such as by CMP, to the height of the sidewall spacer 30. Then, a middle electrode layer 60, selector layer 55, and top electrode layer 50 are formed, and patterned to form the phase change random access memory device as shown in FIG. 10B. In some embodiments, the dielectric layer 20 is etched during the patterning operation of the top electrode layer 50, selector layer 55, and middle electrode layer 60.

Figure 11A:
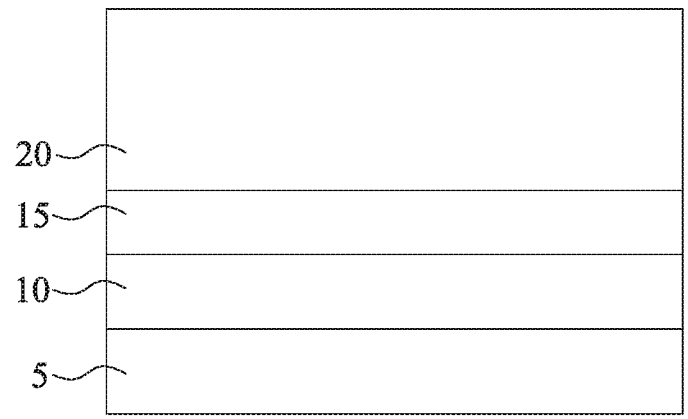
FIGS. 11A, 11B, and 11C illustrate various stages of a sequential operation of a method of manufacturing a PCRAM according to an embodiment of the present disclosure.
Figure 11B:
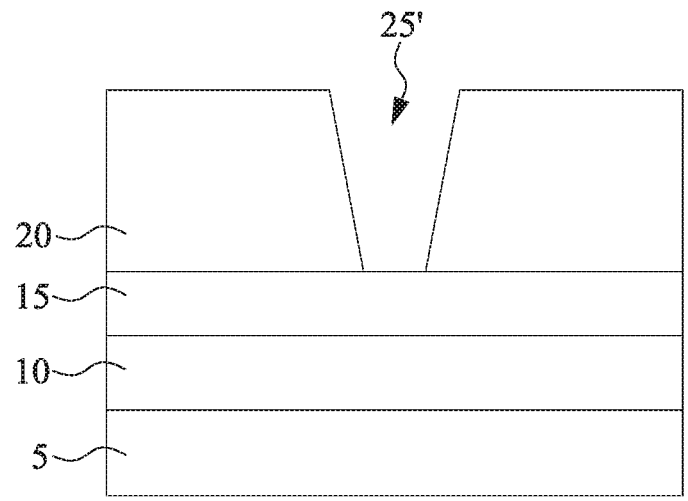
Figure 11C:
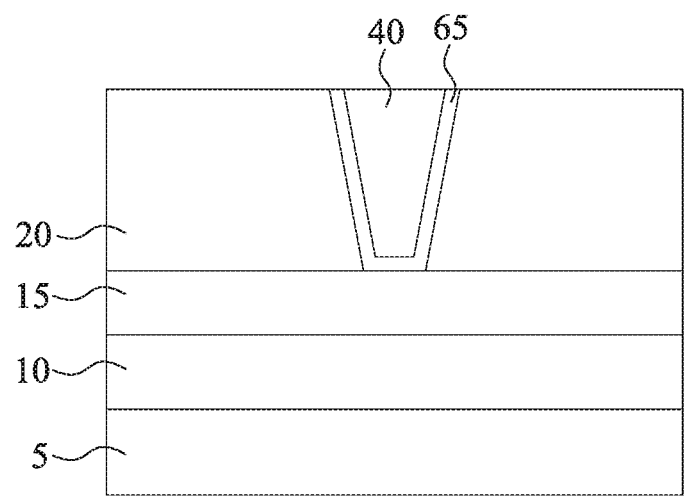

FIGS. 11A, 11B, and 11C illustrate forming a trapezoidal-shaped bottom electrode layer 40 according to another embodiment of the disclosure. A conductive layer 15 is formed over an ILD layer 10, which is formed over a substrate 5, as shown in FIG. 11A. A dielectric layer 20 is formed over the conductive layer 15. The material layers and manufacturing operations are the same as those previously discussed herein. A substantially trapezoidal-shaped opening (or trench) 25' exposing the upper surface of the conductive layer 15 is formed using photolithographic and etching operations in some embodiments, as shown in FIG. 11B. The etching operation is an isotropic etching operation to form a tapered profile. A liner layer 65 is formed in some embodiments over the conductive layer 15 and sidewall of the opening 25', and a bottom electrode layer 40 is formed in the opening (or trench) 25', as shown in FIG. 11C. The liner layer 65 and bottom electrode layer 40 are formed of the same materials and using the same operations as discussed in reference to FIG. 3. The device of FIG. 11C then undergoes further manufacturing operations as discussed in reference to FIGS. 4-10B.

Figure 12A:
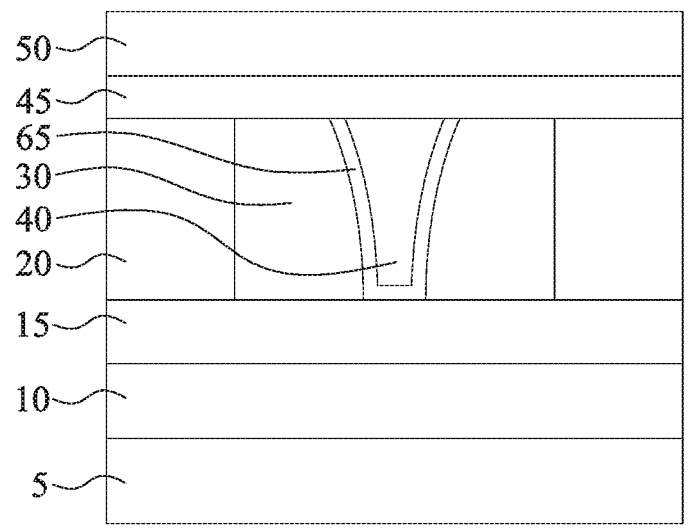
FIGS. 12A and 12B illustrate various stages of a sequential operation of a method of manufacturing a PCRAM according to an embodiment of the present disclosure.
Figure 12B:
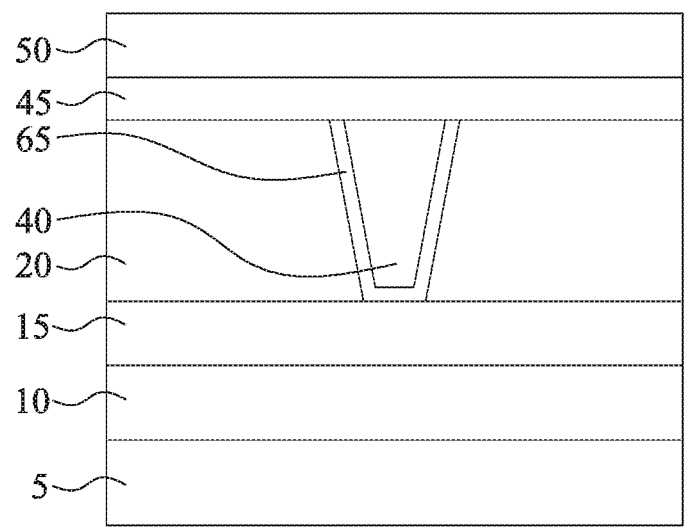

In some embodiments, the phase change material layer 45 is formed over the bottom electrode 40 and dielectric layer 20 without an operation of recessing the bottom electrode layer 40, as shown in FIGS. 12A and 12B. Thus, a bottom surface of the phase change material layer 45 is substantially coplanar with upper surfaces of the bottom electrode 40 and dielectric layer 20.

Figure 13:
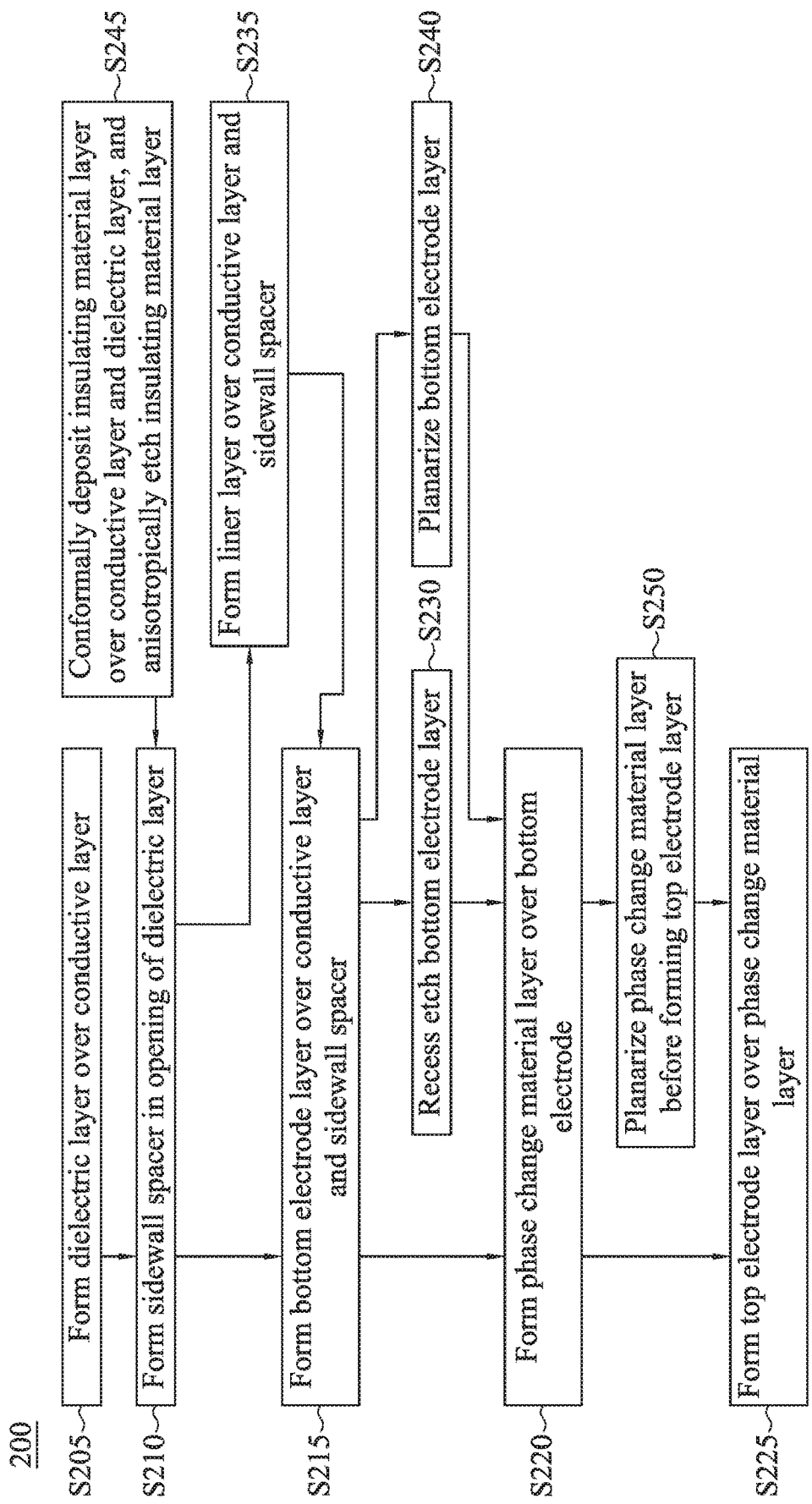
FIG. 13 is a flowchart illustrating a method of manufacturing a PCRAM according to embodiments of the present disclosure.

FIG. 13 is a flowchart illustrating a method 200 according to embodiments of the present disclosure. In operation S205, a dielectric layer 20 is formed over a conductive layer 15. A sidewall spacer 30 is formed on the dielectric layer 20 in the opening 25 in operation S210 (see FIGS. 1 and 2). Then, in operation S215, a bottom electrode layer 40 is formed over the conductive layer 15 and the sidewall spacer 30. A phase change material layer 45 is subsequently formed in operation S220 over the bottom electrode layer 40 and a top electrode layer 50 is formed over the phase change material layer 45 in operation S225 (see FIGS. 3 and 5).

Figure 4:
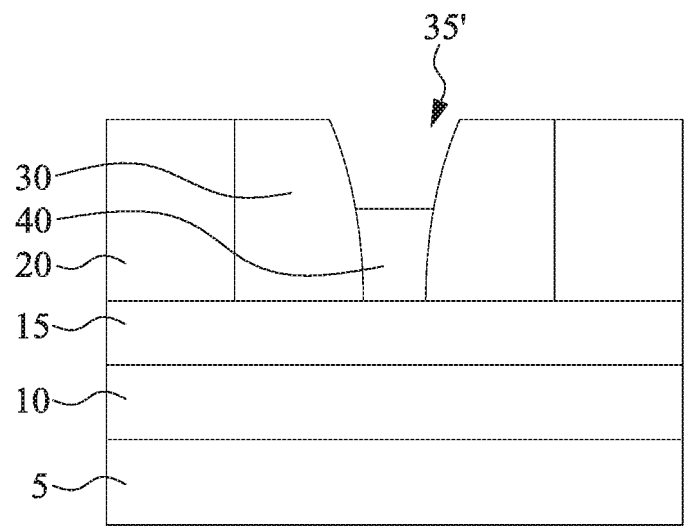
FIG. 4 illustrates one of the various stages of a sequential operation of a method of manufacturing a PCRAM according to an embodiment of the present disclosure.

In some embodiments, the method 200 includes recess etching the bottom electrode layer 40 in operation S230 before forming the phase change material layer (see FIG. 4). In some embodiments, the method 200 includes forming a liner layer 65 over the conductive layer 15 and the sidewall spacer 30 in operation S235 before operation S215 of forming the bottom electrode layer 40. In some embodiments, the method 200 includes operation S240 of planarizing the bottom electrode layer 40 before operation S220 of forming the phase change material layer 45. In some embodiments, the operation S210 of forming the sidewall spacer 30 includes an operation S245 of conformally depositing an insulating material layer over the conductive layer 15 and the dielectric layer 20, and anisotropically etching the insulating material layer to form an opening (or trench) 35 exposing the conductive layer 15 (See FIG. 2). In some embodiments, the method 200 includes planarizing the phase change material layer 45 in operation S250 before forming the top electrode layer 50.

Figure 14:
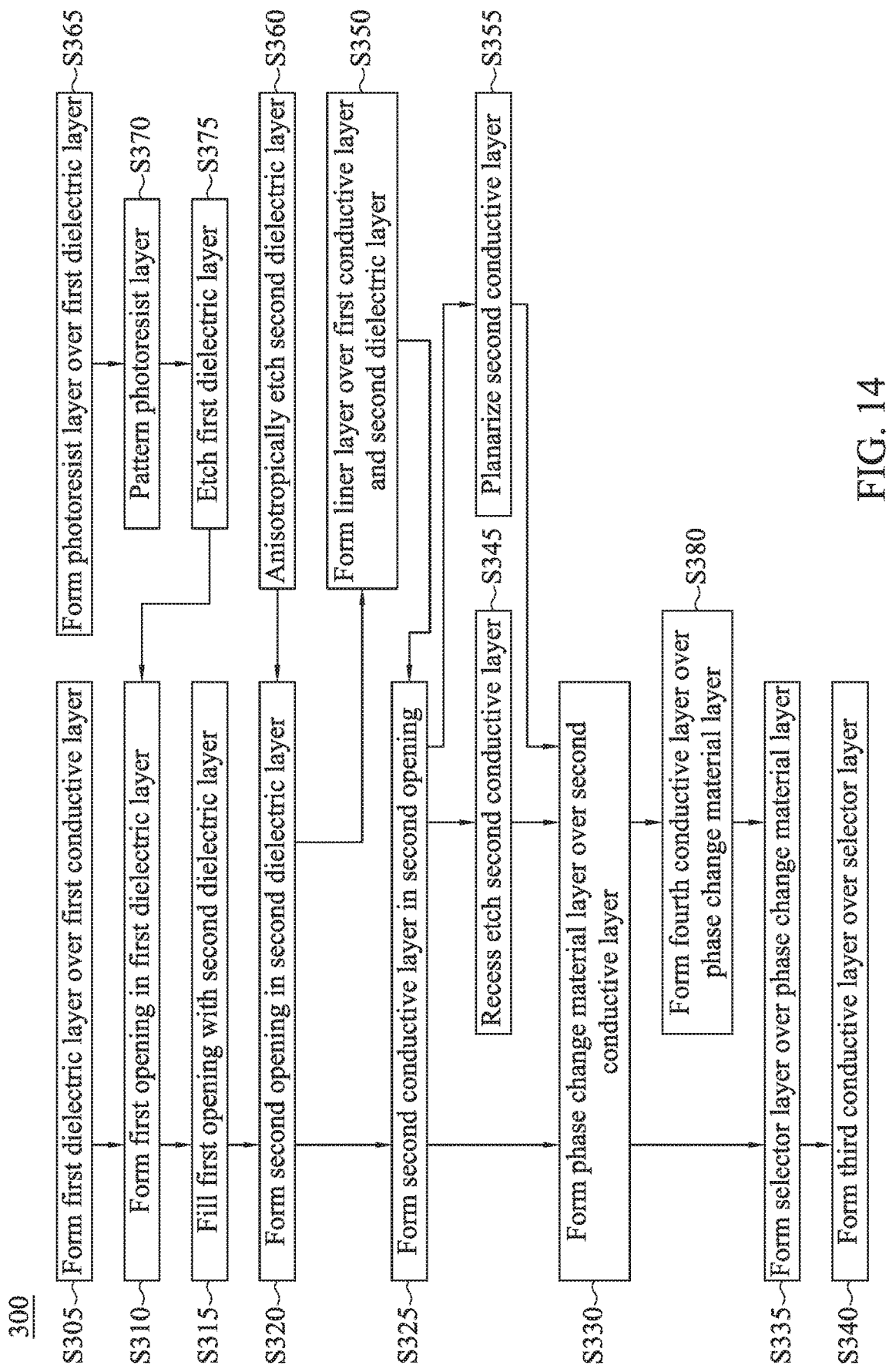
FIG. 14 is a flowchart illustrating a method of manufacturing a PCRAM according to embodiments of the present disclosure.

FIG. 14 is a flowchart illustrating a method 300 according to embodiments of the present disclosure. In operation S305, a first dielectric layer 20 is formed over a first conductive layer 15. A first opening 25 is formed in the first dielectric layer 20 exposing the first conductive layer 15 in operation S310 (see FIG. 1). The first opening 25 is filled with a second dielectric layer 30 in operation S310, and a second opening 35 is formed in the second dielectric layer 30 exposing the first conductive layer 15 in operation S320 (see FIG. 2). A width of second opening 35 is less than a width of the first opening 25. A second conductive layer 40 is formed in the second opening 35 in operation S325 (see FIG. 3). A phase change material layer 45 is formed over the second conductive layer 40 in operation S330. A selector layer 55 is subsequently formed over the phase change material layer 45 in operation S335, and a third conductive layer 50 is formed over the selector layer 55 in operation S340 (See FIGS. 7B and 8B).

In some embodiments, the method 300 includes recess etching the second conductive layer 40 in operation S345 before the operation S330 of forming the phase change material layer 45. In some embodiments, the method 300 includes an operation S350 of forming a liner layer 65 over the first conductive layer 15 and the second dielectric layer 30 before forming the second conductive layer 40. In some embodiments, the method 300 includes an operation S355 of planarizing the second conductive layer 40 before forming the phase change material layer. In some embodiments, the method 300 includes an operation S360 of anisotropically etching the second dielectric layer 30 to expose the first conductive layer 15 during the forming the second opening 35 in the second dielectric layer 30 of operation S320. In some embodiments, the forming a first opening 25 in the first dielectric layer 20 of operation S305 includes an operation S365 of forming a photoresist layer over the first dielectric layer 20, an operation S370 of patterning the photoresist layer to form an opening in the photoresist layer to expose a portion of the first dielectric layer 20, and an operation S375 of etching the first dielectric layer 20 through the opening in the photoresist layer to expose the first conductive layer 15. In some embodiments, the method 300 includes an operation S380 of forming a fourth conductive layer 60 over the phase change material layer 45 before forming selector layer 55 in operation S335.

Figure 15:
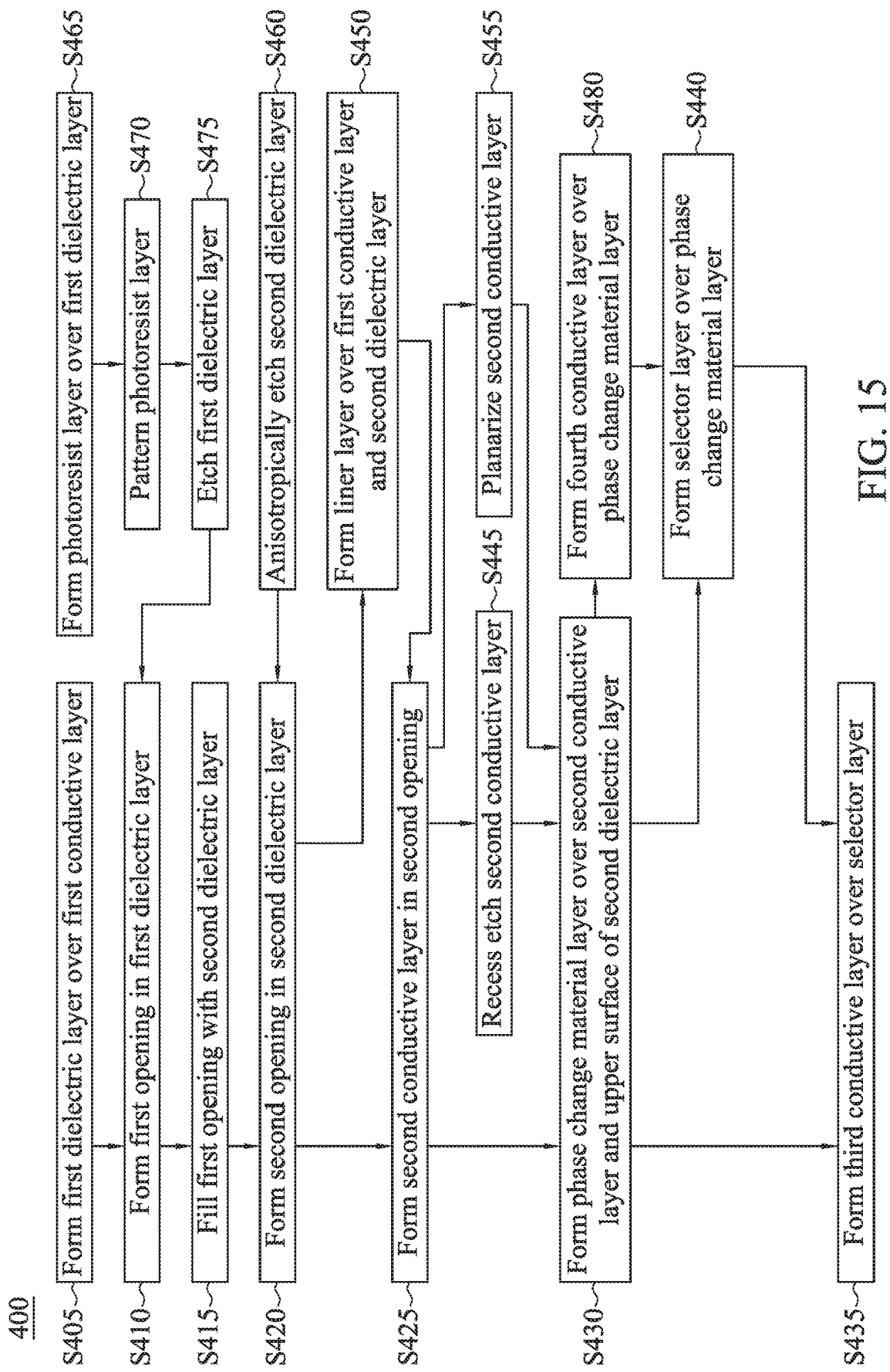
FIG. 15 is a flowchart illustrating a method of manufacturing a PCRAM according to embodiments of the present disclosure.

FIG. 15 is a flowchart illustrating a method 400 according to embodiments of the present disclosure. In operation S405, a first dielectric layer 20 is formed over a first conductive layer 15. A first opening 25 is formed in the first dielectric layer 20 in operation S410 exposing the first conductive layer 15. In operation S415, the first opening is filled with a second dielectric layer 30, and a second opening 35 is formed in the second dielectric layer 30 exposing the first conductive layer 15 in operation S420. A width of second opening 35 is less than a width of the first opening 25. In operation S425, a second conductive layer 40 is formed in the second opening. Then, in operation S430, a phase change material layer 45 is formed over the second conductive layer 40 and an upper surface of the second dielectric layer 30 (see FIG. 5A). A third conductive layer 50 is formed over the phase change material layer 45 in operation S435. The third conductive layer 50 is spaced-apart from the second dielectric layer 30, and the phase change material layer 45 is between the third conductive layer 50 and an upper surface of second dielectric layer 30 (see FIG. 5A).

Figure 7B:
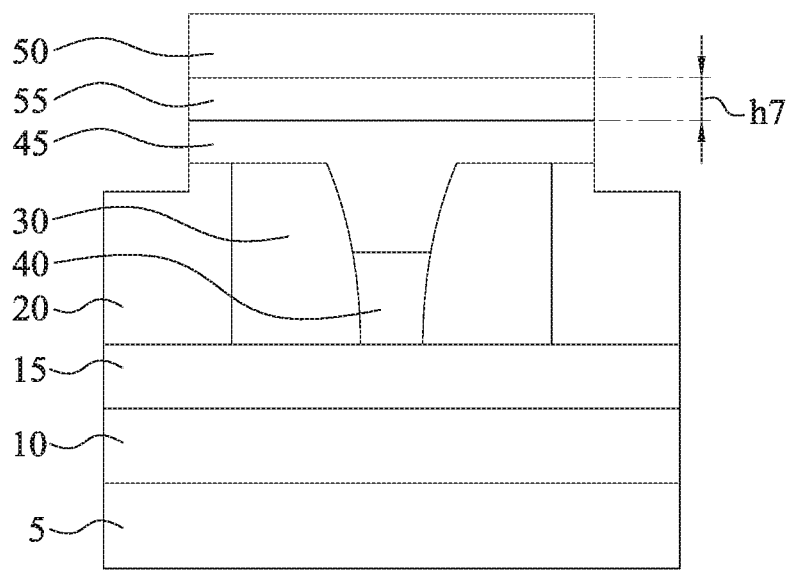

In some embodiments, the method 400 includes an operation S440 of forming a selector layer 55 over the phase change material layer 45 before the operation S435 of forming the third conductive layer (see FIG. 7B). In some embodiments, the method 400 includes an operation S445 of recess etching the second conductive layer 40 before the operation S430 of forming the phase-change material layer 45. In some embodiments, the method 400 includes forming a liner layer 65 over the first conductive layer 15 and over the second dielectric layer 30 before the operation S425 of forming the second conductive layer 40. In some embodiments, the method 400 includes an operation S455 of planarizing the second conductive layer 40 before the operation S430 of forming the phase change material layer 45. In some embodiments, the operation S420 of forming the second opening 35 in the second dielectric layer 30 includes an operation S460 of anisotropically etching the second dielectric layer 30 to expose the first conductive layer 15.

In some embodiments, the operation S405 of forming a first opening 25 in the first dielectric layer 20 exposing the first conductive layer 405 includes: an operation S465 of forming a photoresist layer over the first dielectric layer 20, an operation S470 of patterning the photoresist layer to form an opening in the photoresist layer to expose a portion of the first dielectric layer 20, and etching the first dielectric layer 20 through the opening in the photoresist layer to expose the first conductive layer 15 in operation S475. In some embodiments, the method 400 includes an operation S480 of forming a fourth conductive layer 60 over the phase change material layer 45 before the operation S440 of forming the selector layer 55 (see FIGS. 9B and 10B). In some embodiments, the phase change material layer 45, fourth conductive layer 60, selector layer 55, and third conductive layer 50 are formed over the second dielectric layer 30 and then a portion of the phase change material layer 45, fourth conductive layer 60, selector layer 55, and third conductive layer 50 is removed (see FIGS. 9B and 10B). In some embodiments, the portion of the phase change material layer 45, fourth conductive layer 60, selector layer 55, and third conductive layer 50 is removed using photolithographic patterning and etching operations.

Figure 16:
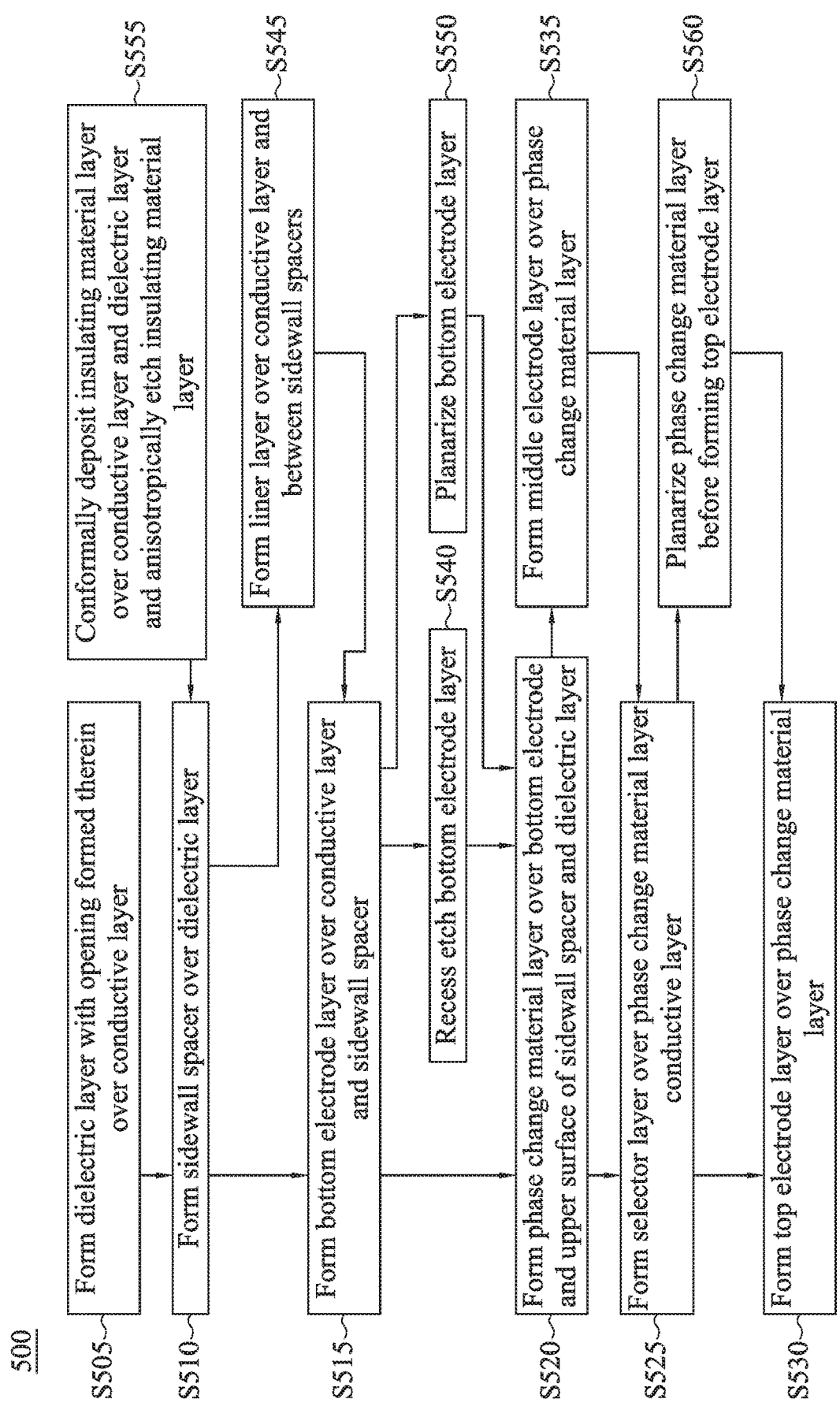
FIG. 16 is a flowchart illustrating a method of manufacturing a PCRAM according to embodiments of the present disclosure.

FIG. 16 is a flowchart illustrating a method 500 according to embodiments of the present disclosure. In operation S505, a dielectric layer 20 with an opening 25 therein is formed over a conductive layer 15. In operation S510, a sidewall spacer 30 is formed over the dielectric layer 20. A bottom electrode layer 40 is then formed over the conductive layer 15 and the sidewall spacer 30 in operation S515. A phase change material layer 45 is subsequently formed over the bottom electrode 40, and over an upper surface of the sidewall spacer 30 and the dielectric layer 20 in operation S520. Then, in operation S525, a selector layer 55 is formed over the phase change material layer 45. The selector layer 55 is spaced-apart from the sidewall spacer 30, and the phase-change material layer 45 is between the selector layer 55 and the sidewall spacer 30 (see FIG. 7B). In operation S530, a top electrode layer 50 is formed over the phase change material layer 45.

In some embodiments, the method 500 includes an operation S535 forming a middle electrode layer 60 over the phase-change material layer 45 before the operation S525 of forming the selector layer 55. In some embodiments, the method 500 includes an operation S540 of recess etching the bottom electrode layer 40 before the operation S520 of forming the phase change material layer 45. In some embodiments, the method 500 includes an operation S545 of forming a liner layer 65 over the conductive layer 15 and between the sidewall spacer 30 before the operation S515 of forming the bottom electrode layer 40. In some embodiments, the method 500 includes an operation S550 of planarizing the bottom electrode layer 40 before the operation S520 of forming the phase change material layer 45. In some embodiments, the operation S510 of forming the sidewall spacer 30 includes an operation S555 of conformally depositing an insulating material layer over the conductive layer 15 and the dielectric layer 20, and anisotropically etching the insulating material layer to expose the conductive layer 15. In some embodiments, the method 500 includes an operation S560 of planarizing the phase change material layer 45 before the operation S530 of forming the top electrode layer 50 (see FIG. 5B).

Embodiments of the present disclosure provide smaller bottom electrodes with good joule heating efficiency, which is needed for the phase change. The trapezoidal shaped bottom electrode, according to some embodiments of the disclosure, provides low contact resistance between the phase change material layer and the bottom electrode. The trapezoidal-shaped phase change material layer, according to some embodiments of the disclosure, provides low contact resistance between the phase change material layer and the top electrode. In addition, forming bottom electrodes according to the present disclosure allows the formation of bottom electrodes at sizes below the photolithographic resolution of photolithographic exposure system. The methods of the present disclosure produce smaller PCRAM devices with using costly and difficult advanced photolithographic and etching techniques. Phase change random access memory devices according to embodiments of the present disclosure can operate at reduced write current.

An embodiment of the disclosure is a method, including forming a dielectric layer over a conductive layer, and forming a sidewall spacer in an opening in the dielectric layer. The opening exposes a portion of the conductive layer. A bottom electrode layer is formed over the conductive layer and the sidewall spacer. A phase change material layer is formed over the bottom electrode layer, and a top electrode layer is formed over the phase change material layer. In an embodiment, the method includes recess etching the bottom electrode layer before forming the phase change material layer. In an embodiment, the method includes a liner layer formed over the conductive layer and the sidewall spacer before forming the bottom electrode layer. In an embodiment, the method includes planarizing the bottom electrode layer before forming the phase change material layer. In an embodiment, the forming the sidewall spacer includes: conformally depositing an insulating material layer over the conductive layer and the pair of spaced-apart dielectric layers, and anisotropically etching the insulating material layer to expose the conductive layer. In an embodiment, the method includes planarizing the phase change material layer before forming the top electrode layer.

Another embodiment of the disclosure is a method, including forming a first dielectric layer over a first conductive layer. A first opening is formed in the first dielectric layer exposing the first conductive layer. The first opening is filled with a second dielectric layer, and a second opening is formed in the second dielectric layer exposing the first conductive layer. A width of second opening is less than a width of the first opening. A second conductive layer is formed in the second opening. A phase change material layer is formed over the second conductive layer. A selector layer is formed over the phase change material layer, and a third conductive layer is formed over the selector layer. In an embodiment, the method includes recess etching the second conductive layer before forming the phase change material layer. In an embodiment, the method includes forming a liner layer over the first conductive layer and the second dielectric layer before forming the second conductive layer. In an embodiment, the method includes planarizing the second conductive layer before forming the phase change material layer. In an embodiment, the forming the second opening in the second dielectric layer includes anisotropically etching the second dielectric layer to expose the first conductive layer. In an embodiment, the forming a first opening in the first dielectric layer exposing the first conductive layer includes forming a photoresist layer over the first dielectric layer, patterning the photoresist layer to form an opening in the photoresist layer to expose a portion of the first dielectric layer, and etching the first dielectric layer through the opening in the photoresist layer to expose the first conductive layer. In an embodiment, the method includes forming a fourth conductive layer over the phase change material layer before forming selector layer.

Another embodiment of the disclosure is a phase change random access memory device, including a dielectric layer with a trench formed therein disposed over a conductive layer. A sidewall spacer is disposed on a sidewall of the dielectric layer in the trench. A bottom electrode layer is disposed over the conductive layer and the sidewall spacer. A phase change material layer is disposed over the bottom electrode, and a top electrode layer is disposed over the phase change material layer. In an embodiment, the bottom electrode layer is substantially trapezoidal shaped in cross section. In an embodiment, the phase change material is formed over the sidewall spacer. In an embodiment, an upper surface of the phase change material layer is flush with an upper surface of the sidewall spacer. In an embodiment, the phase change random access memory device includes a liner layer disposed between the bottom electrode layer, and conductive layer and the sidewall spacer. In an embodiment, the top electrode layer is in direct contact with an upper surface of the sidewall spacer. In an embodiment, the phase change material includes one or more layers of a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. In an embodiment, the phase change random access memory device includes a selector layer between the phase change material layer and the top electrode layer. In an embodiment, the selector layer is in direct contact with an upper surface of the sidewall spacer. In an embodiment, the phase change random access memory device includes a middle electrode layer between the phase change material layer and the selector layer. In an embodiment, the middle electrode layer is in direct contact with an upper surface of the sidewall spacer. In an embodiment, the middle electrode layer has a thickness ranging from 2 nm to 50 nm. In an embodiment, the middle electrode layer has a thickness ranging from 5 nm to 20 nm. In an embodiment, the middle electrode layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the selector layer has a thickness ranging from 2 nm to 50 nm. In an embodiment, the selector layer has a thickness ranging from 5 nm to 20 nm. In an embodiment, the selector layer includes one or more layers of $SiO_x$, $TiO_x$, $AlO_x$, $WO_x$, $Ti_xN_yO_z$, $HfO_x$, $TaO_x$, $NbO_x$, where x, y and z are non-stoichiometric values; a solid-electrolyte material containing one or more of Ge, Sb, S, Te; or N, P, S, Si, or Te doped AsGeSe or AsGeSeSi; or combinations thereof. In an embodiment, the bottom electrode layer has a thickness ranging from 5 nm to 100 nm. In an embodiment, the bottom electrode layer has a thickness ranging from 10 nm to 50 nm. In an embodiment, the bottom electrode layer has a bottom surface width ranging from 0.5 nm to 50 nm. In an embodiment, the bottom electrode layer has a bottom surface width ranging from 1 nm to 15 nm. In an embodiment, the bottom electrode layer has a top surface width ranging from 1 nm to 70 nm. In an embodiment, the bottom electrode layer has a top surface width ranging from 3 nm to 20 nm. In an embodiment, the phase change material layer has a thickness ranging from 5 nm to 200 nm. In an embodiment, the phase change material layer has a thickness ranging from 30 nm to 100 nm. In an embodiment, the phase change material layer extends 10 nm to 100 nm above a top surface of the sidewall spacer. In an embodiment, the phase change material layer extends 20 nm to 50 nm above the top surface of the sidewall spacer. In an embodiment, the phase change material layer has a bottom surface width ranging from 1 nm to 70 nm. In an embodiment, the phase change material layer has a bottom surface width ranging from 3 nm to 20 nm. In an embodiment, the phase change material layer has a top surface width ranging from 2 nm to 100 nm. In an embodiment, the phase change material layer has a top surface width ranging from 5 nm to 30 nm. In an embodiment, the top electrode layer has a thickness ranging from 5 nm to 100 nm. In an embodiment, the top electrode layer has a thickness ranging from 10 nm to 30 nm. In an embodiment, the bottom electrode layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the top electrode layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof.

Another embodiment of the disclosure is a method, including forming a dielectric layer over a conductive layer. The dielectric layer includes an opening exposing a portion of the conductive layer. A sidewall spacer is formed in the opening of the dielectric layer. A bottom electrode layer is formed over the conductive layer and the sidewall spacer. A phase change material layer is formed over the bottom electrode, and over an upper surface of the sidewall spacer and the dielectric layer. A selector is formed over the phase change material layer. The selector layer is spaced-apart from the sidewall spacer, and the phase-change material layer is between the selector layer and the sidewall spacer. A top electrode layer is formed over the phase change material layer. In an embodiment, the method includes forming a middle electrode layer over the phase-change material layer before forming the selector layer. In an embodiment, the method includes recess etching the bottom electrode layer before forming the phase change material layer. In an embodiment, the method includes forming a liner layer over the conductive layer and the sidewall spacer before forming the bottom electrode layer. In an embodiment, the method includes planarizing the bottom electrode layer before forming the phase change material layer. In an embodiment, forming the sidewall spacer includes conformally depositing an insulating material layer over the conductive layer and the dielectric layer, and anisotropically etching the insulating material layer to expose the conductive layer. In an embodiment, the method includes planarizing the phase change material layer before forming the top electrode layer.

Another embodiment of the disclosure is a method, including forming a first dielectric layer over a first conductive layer. A first opening is formed in the first dielectric layer exposing the first conductive layer, and the first opening is filled with a second dielectric layer. A second opening is formed in the second dielectric layer exposing the first conductive layer. A width of second opening is less than a width of the first opening. A second conductive layer is formed in the second opening. A phase change material layer is formed over the second conductive layer and an upper surface of the second dielectric layer. A third conductive layer is formed over the phase change material layer. The third conductive layer is spaced-apart from the second dielectric layer, and the phase change material layer is between the third conductive layer and an upper surface of second dielectric layer. In an embodiment, the method includes forming a selector layer over the phase change material layer before the forming the third conductive layer. In an embodiment, the method includes recess etching the second conductive layer before forming the phase-change material layer. In an embodiment, the method includes forming a liner layer over the first conductive layer and between the second dielectric layers before forming the second conductive layer. In an embodiment, the method includes planarizing the second conductive layer before forming the phase change material layer. In an embodiment, the forming the second dielectric layers includes conformally depositing a second dielectric layer over the first conductive layer and the first dielectric layer, and anisotropically etching the second dielectric layer to expose the first conductive layer. In an embodiment, the forming a first opening in the first dielectric layer exposing the first conductive layer includes: forming a photoresist layer over the first dielectric layer, patterning the photoresist layer to form an opening in the photoresist layer to expose a portion of the first dielectric layer, and etching the first dielectric layer through the opening in the photoresist layer to expose the first conductive layer. In an embodiment, the method includes forming a fourth conductive layer over the phase change material layer before forming the selector layer. In an embodiment, the phase change material layer, fourth conductive layer, selector layer, and third conductive layer are formed over the second dielectric layer and then a portion of the phase change material layer, fourth conductive layer, selector layer, and third conductive layer is removed.

Another embodiment of the disclosure is a phase change random access memory device, including a dielectric layer disposed over a conductive layer. A sidewall spacer is disposed on sidewalls of a trench in the dielectric layer. A bottom electrode layer is disposed over the conductive layer and the sidewall spacer. A phase change material layer is disposed over the bottom electrode and over an upper surface of the sidewall spacer. A top electrode layer is disposed over the phase change material layer. The top electrode layer is spaced-apart from the sidewall spacer, and the phase change material is between the top electrode layer and the sidewall spacer.

Another embodiment of the disclosure is a phase change random access memory device, including a first dielectric layer disposed on a first conductive layer. A second dielectric layer is disposed over sidewalls of an opening in the first dielectric layer and on the first conductive layer. A second conductive layer is disposed on the first conductive layer the second dielectric layers. A phase change material layer is disposed over the second conductive layer and the second dielectric layers. A selector layer is disposed over the phase change material layer, and a third conductive layer disposed over the selector layer. In an embodiment, the selector layer is in direct contact with an upper surface of the second dielectric layer. In an embodiment, the phase change random access memory device includes a middle electrode layer between the phase change material layer and the selector layer. In an embodiment, the middle electrode layer is in direct contact with an upper surface of the second dielectric layer. In an embodiment, the middle electrode layer has a thickness ranging from 2 nm to 50 nm. In an embodiment, the middle electrode layer has a thickness ranging from 5 nm to 20 nm. In an embodiment, the middle electrode layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the selector layer has a thickness ranging from 2 nm to 50 nm. In an embodiment, the selector layer has a thickness ranging from 5 nm to 20 nm. In an embodiment, the selector layer includes one or more layers of $SiO_x$, $TiO_x$, $AlO_x$, $WO_x$, $Ti_xN_yO_z$, $HfO_x$, $TaO_x$, $NbO_x$, where x, y and z are non-stoichiometric values; a solid-electrolyte material containing one or more of Ge, Sb, S, Te; or N, P, S, Si, or Te doped AsGeSe or AsGeSeSi; or combinations thereof. In an embodiment, the second conductive layer has a thickness ranging from 5 nm to 100 nm. In an embodiment, the second conductive layer has a thickness ranging from 10 nm to 50 nm. In an embodiment, the second conductive layer has a bottom surface width ranging from 0.5 nm to 50 nm. In an embodiment, the second conductive layer has a bottom surface width ranging from 1 nm to 15 nm. In an embodiment, the second conductive layer has a top surface width ranging from 1 nm to 70 nm. In an embodiment, the second conductive layer has a top surface width ranging from 3 nm to 20 nm. In an embodiment, the phase change material layer has a thickness ranging from 5 nm to 200 nm. In an embodiment, the phase change layer has a thickness ranging from 30 nm to 100 nm. In an embodiment, the phase change material layer extends 10 nm to 100 nm above a top surface of the second dielectric layer. In an embodiment, the phase change material layer extends 20 nm to 50 nm above the top surface of the second dielectric layer. In an embodiment, the phase change material layer has a bottom surface width ranging from 1 nm to 70 nm. In an embodiment, the phase change material layer has a bottom surface width ranging from 3 nm to 20 nm. In an embodiment, the phase change material layer has a top surface width ranging from 2 nm to 100 nm. In an embodiment, the phase change material layer has a top surface width ranging from 5 nm to 30 nm. In an embodiment, the third conductive layer has a thickness ranging from 5 nm to 100 nm. In an embodiment, the third conductive layer has a thickness ranging from 10 nm to 30 nm. In an embodiment, the second conductive layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the third conductive layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the phase change material includes one or more layers of a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof.

Another embodiment is a phase change random access memory device, including a first dielectric layer having a trench therein disposed on a first conductive layer. A second dielectric layer is disposed over the first conductive layer and the first dielectric layer. A second conductive layer is disposed on the first conductive layer and the second dielectric layer. A phase change material layer is disposed over the second conductive layer and over an upper surface of the second dielectric layer distal to the first conductive layer, and a third conductive layer is disposed over the phase change material layer. The third conductive layer is spaced apart from the second dielectric layer. In an embodiment, the second conductive layer has a thickness ranging from 5 nm to 100 nm. In an embodiment, the second conductive layer has a thickness ranging from 10 nm to 50 nm. In an embodiment, the second conductive layer has a bottom surface width ranging from 0.5 nm to 50 nm. In an embodiment, the second conductive layer has a bottom surface width ranging from 1 nm to 15 nm. In an embodiment, the second conductive layer has a top surface width ranging from 1 nm to 70 nm. In an embodiment, the second conductive layer has a top surface width ranging from 3 nm to 20 nm. In an embodiment, the phase change material layer has a thickness ranging from 5 nm to 200 nm. In an embodiment, the phase change layer has a thickness ranging from 30 nm to 100 nm. In an embodiment, the phase change material layer extends 10 nm to 100 nm above a top surface of the second dielectric layer. In an embodiment, the phase change material layer extends 20 nm to 50 nm above the top surface of the second dielectric layer. In an embodiment, the phase change material layer has a bottom surface width ranging from 1 nm to 70 nm. In an embodiment, the phase change material layer has a bottom surface width ranging from 3 nm to 20 nm. In an embodiment, the phase change material layer has a top surface width ranging from 2 nm to 100 nm. In an embodiment, the phase change material layer has a top surface width ranging from 5 nm to 30 nm. In an embodiment, the third conductive layer has a thickness ranging from 5 nm to 100 nm. In an embodiment, the third conductive layer has a thickness ranging from 10 nm to 30 nm. In an embodiment, the second conductive layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the third conductive layer includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In an embodiment, the phase change material includes one or more layers of a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof.

Another embodiment of the disclosure is a method, including forming a dielectric layer over a conductive layer. A tapered opening is formed in the dielectric layer exposing a portion of the conductive layer. A first width of the opening at an upper surface of the conductive layer is less than a second width of an opposing end of the tapered opening. A second conductive layer is formed in the opening. A phase change material layer is formed over the second conductive layer, and a third conductive layer is formed over the phase change material layer. In an embodiment, the method includes etching the first conductive layer before forming the phase change material layer. In an embodiment, the method includes forming a liner layer over the first conductive layer and the dielectric layer before forming the second conductive layer. In an embodiment, the method includes planarizing the second conductive layer before forming the phase change material layer. In an embodiment, the forming the tapered opening includes isotropically etching the dielectric layer to expose the first conductive layer. In an embodiment, the method includes planarizing the phase change material layer before forming the third conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer over a conductive layer;
   forming a sidewall spacer in an opening in the dielectric layer,
   wherein the opening exposes a portion of the conductive layer;
   forming a bottom electrode layer over the conductive layer and the sidewall spacer;
   forming a phase change material layer over the bottom electrode layer; and
   forming a top electrode layer over the phase change material layer.

2. The method according to claim 1, further comprising recess etching the bottom electrode layer before forming the phase change material layer.

3. The method according to claim 1, further comprising forming a liner layer over the conductive layer and the sidewall spacer before forming the bottom electrode layer.

4. The method according to claim 1, further comprising planarizing the bottom electrode layer before forming the phase change material layer.

5. The method according to claim 1, wherein the forming the sidewall spacers comprises:
   conformity depositing an insulating material layer over the conductive layer and the dielectric layer; and
   anisotropically etching the insulating material layer to expose the conductive layer.

6. The method according to claim 1, further comprising planarizing the phase change material layer before forming the top electrode layer.

7. A method, comprising:
forming a first dielectric layer over a first conductive layer;
forming a first opening in the first dielectric layer exposing the first conductive layer;
filling the first opening with a second dielectric layer;
forming a second opening in the second dielectric layer exposing the first conductive layer,
wherein a width of second opening is less than a width of the first opening;
forming a second conductive layer in the second opening;
forming a phase change material layer over the second conductive layer;
forming a selector layer over the phase change material layer; and
forming a third conductive layer over the selector layer.

8. The method according to claim 7, further comprising recess etching the second conductive layer before forming the phase change material layer.

9. The method according to claim 7, further comprising forming a liner layer over the first conductive layer and the second dielectric layer before forming the second conductive layer.

10. The method according to claim 7, further comprising planarizing the second conductive layer before forming the phase change material layer.

11. The method according to claim 7, wherein the forming a second opening in the second dielectric layer comprises anisotropically etching the second dielectric layer to expose the first conductive layer.

12. The method according to claim 7, wherein the forming a first opening in the first dielectric layer exposing the first conductive layer comprises:
forming a photoresist layer over the first dielectric layer;
patterning the photoresist layer to form an opening in the photoresist layer to expose a portion of the first dielectric layer; and
etching the first dielectric layer through the opening in the photoresist layer to expose the first conductive layer.

13. The method according to claim 7, further comprising forming a fourth conductive layer over the phase change material layer before forming selector layer.

14. A method, comprising:
forming a dielectric layer over a conductive layer,
wherein the dielectric layer includes an opening exposing a portion of the conductive layer;
forming a sidewall spacer in the opening of the dielectric layer;
forming a bottom electrode layer over the conductive layer and the sidewall spacer;
forming a phase change material layer over the bottom electrode, and over an upper surface of the sidewall spacer and the dielectric layer;
forming a selector layer over the phase change material layer, wherein the selector layer is spaced-apart from the sidewall spacer, and the phase-change material layer is between the selector layer and the sidewall spacer; and
forming a top electrode layer over the phase change material layer.

15. The method according to claim 14, further comprising forming a middle electrode layer over the phase change material layer before forming the selector layer.

16. The method according to claim 14, further comprising recess etching the bottom electrode layer before forming the phase change material layer.

17. The method according to claim 14, further comprising forming a liner layer over the conductive layer and between the sidewall spacers before forming the bottom electrode layer.

18. The method according to claim 14, further comprising planarizing the bottom electrode layer before forming the phase change material layer.

19. The method according to claim 14, wherein the forming the sidewall spacer comprises:
conformally depositing an insulating material layer over the conductive layer and the dielectric layer; and
anisotropically etching the insulating material layer to expose the conductive layer.

20. The method according to claim 14, further comprising planarizing the phase change material layer before forming the top electrode layer.

* * * * *